US011416022B2

(12) United States Patent
Martin et al.

(10) Patent No.: US 11,416,022 B2
(45) Date of Patent: Aug. 16, 2022

(54) DEVICE WITH A PLURALITY OF CLOCK DOMAINS

(71) Applicant: STMicroelectronics (Grenoble 2) SAS, Grenoble (FR)

(72) Inventors: Stephane Martin, Gieres (FR); Denis Dutey, Jarrie (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 268 days.

(21) Appl. No.: 16/879,535

(22) Filed: May 20, 2020

(65) Prior Publication Data

US 2020/0379506 A1 Dec. 3, 2020

(30) Foreign Application Priority Data

May 28, 2019 (FR) ...................................... 1905660

(51) Int. Cl.
| | | |
|---|---|---|
| *G06J 1/02* | (2006.01) | |
| *G06F 1/14* | (2006.01) | |
| *G06F 1/08* | (2006.01) | |
| *H04L 7/02* | (2006.01) | |
| *G01R 31/317* | (2006.01) | |

(52) U.S. Cl.
CPC ......... *G06F 1/14* (2013.01); *G01R 31/31727* (2013.01); *G06F 1/08* (2013.01); *H04L 7/02* (2013.01)

(58) Field of Classification Search
USPC ........................ 716/104, 106, 108; 708/102
See application file for complete search history.

(56) References Cited

U.S. PATENT DOCUMENTS

| | | | |
|---|---|---|---|
| 3,196,258 A | 7/1965 | Belcastro | |
| 5,440,604 A | 8/1995 | De Subijana et al. | |
| 6,205,572 B1 * | 3/2001 | Dupenloup | ........... G06F 30/327 716/106 |
| 9,911,496 B2 * | 3/2018 | Mattausch | ............. G11C 15/04 |
| 2004/0205369 A1 | 10/2004 | Retter et al. | |
| 2012/0081567 A1 * | 4/2012 | Cote | ................ H04N 21/41407 348/222.1 |
| 2013/0159769 A1 | 6/2013 | Buban et al. | |
| 2017/0019247 A1 * | 1/2017 | Iyer | ......................... H04L 1/243 |
| 2017/0185502 A1 * | 6/2017 | Iyer | ....................... G06F 11/221 |

FOREIGN PATENT DOCUMENTS

| | | | | |
|---|---|---|---|---|
| KR | 20200045507 A | * | 9/2018 | |
| WO | WO-2008097613 A1 | * | 8/2008 | ........... H04L 1/0041 |
| WO | WO-2010016857 A1 | * | 2/2010 | ............... G06F 1/04 |

OTHER PUBLICATIONS

MacGugan, Douglas C., "Testability of the PAALS Auto-Align Sensor System", Proceedings of the Digitial Avionics Systems Conference, Los Angeles, CA, Oct. 14-17, 1991, 7 pages.

* cited by examiner

*Primary Examiner* — Brian Ngo
(74) *Attorney, Agent, or Firm* — Slater Matsil, LLP

(57) ABSTRACT

In an embodiment a device includes a first circuit configured to send a signal comprising numbers successively separated by a constant value to at least one second circuit, each second circuit being in a clock domain different from a clock domain of the first circuit and at least one third circuit configured to determine whether the successive numbers of the signal received by the second circuit are separated by the constant value, wherein the signal is sent to a respective third circuit in each of the clock domains different from the clock domain of the first circuit.

16 Claims, 4 Drawing Sheets

DEVICE WITH A PLURALITY OF CLOCK DOMAINS

CROSS-REFERENCE TO RELATED APPLICATIONS

This application claims priority to French Patent Application No. 1905660, filed on May 28, 2019, which application is hereby incorporated herein by reference.

TECHNICAL FIELD

The present disclosure generally concerns electronic devices, and more particularly devices comprising a plurality of circuits having different clock domains and receiving signals comprising successive numbers, separated two by two by the same value, coming from a common origin (counter).

BACKGROUND

Electronic devices often comprise circuits operating in different clock domains, that is, with clock signals having different frequencies.

It is known for certain circuits to receive signals comprising successive numbers separated two by two by a same value. For example, each circuit may receive a timestamping signal, that is, a signal enabling to associate a date and an hour to an event, information, or computer data.

SUMMARY

Various embodiments overcome all or part of the disadvantages of known devices with a plurality of clock domains.

An embodiment provides a device comprising a first circuit configured to send, to at least one second circuit, a signal comprising numbers successively separated by a constant value, each second circuit being in a clock domain different from the clock domain of the first circuit, the signal being sent, in each of the clock domains different from the clock domain of the first circuit, to a third circuit configured to determine whether the successive numbers of the signal received by the second circuit are separated by the constant value.

According to an embodiment, each number is a binary number.

According to an embodiment, each number comprises 64 bits.

According to an embodiment, the first and third circuits are coupled by a fourth circuit configured to have a signal transit from the clock domain of the first circuit to the clock domains of the second circuits.

According to an embodiment, the device comprises at least two second circuits in different clock domains.

According to an embodiment, the first circuit is a timestamping circuit.

According to an embodiment, the constant value is equal to 1.

According to an embodiment, each third circuit comprises a comparison circuit configured to compare a number of an input signal with a number of a signal corresponding to the delayed input signal.

According to an embodiment, each third circuit comprises a delay circuit coupled between the input of the third circuit and an input of the comparison circuit.

Another embodiment provides a method of verifying the previous device, comprising the transfer of at least one predetermined number from the first circuit to the third circuits, the number received by the third circuit being compared with the predetermined number.

According to an embodiment, at least two predetermined numbers are transferred, the two predetermined numbers being selected so that each bit forming a number is equal to 0 in at least one of the predetermined numbers and is equal to 1 in at least another one of the predetermined numbers.

According to an embodiment, a circuit is configured to verify that the value of the signal changes in a predetermined time window.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
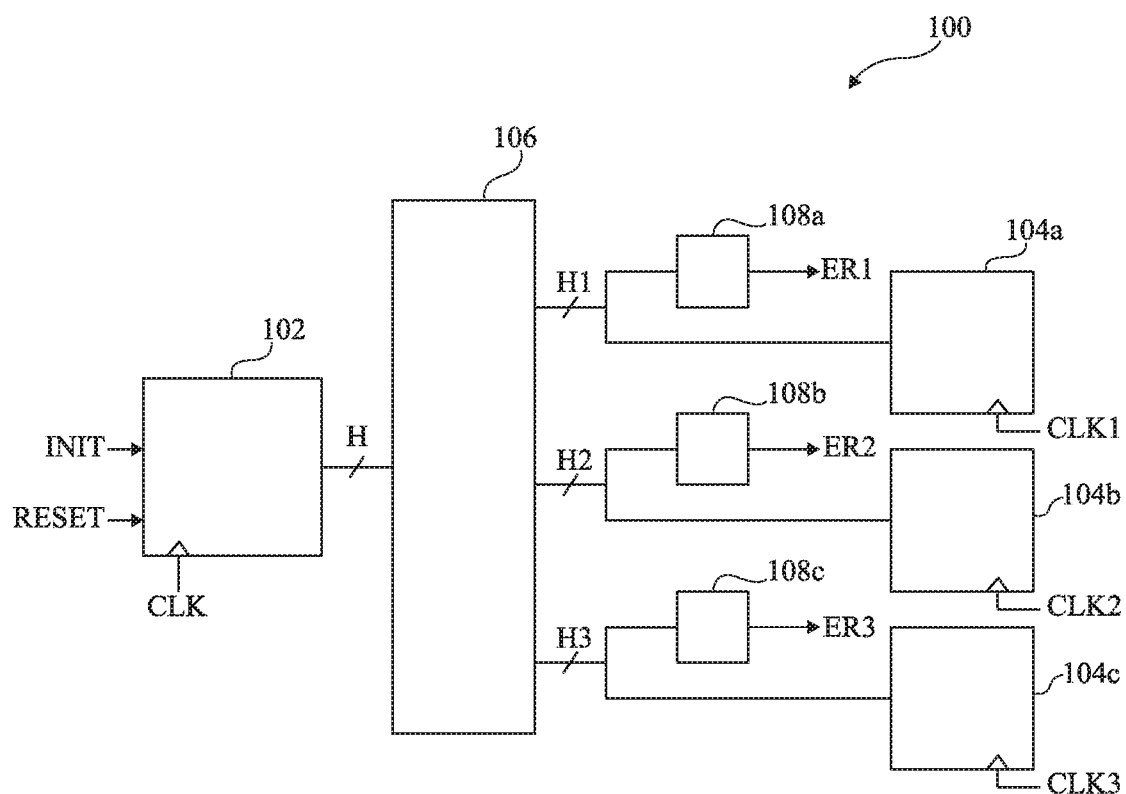
FIG. 1 schematically shows a device comprising a plurality of circuits with clocks having different frequencies.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings.

The terms "about", "substantially", and "approximately" are used herein to designate a tolerance of plus or minus 10%, preferably of plus or minus 5%, of the value in question.

Clock domain means one or a plurality of circuits receiving a same clock signal and operating therewith synchronously.

FIG. 1 schematically shows in the form of blocks a device 100 comprising a plurality of circuits having different clock domains, that is, clocks having different frequencies and receiving signals comprising successive numbers, separated two by two by the same value, coming from a common origin (counter).

Device 100 comprises a generator circuit 102 delivering a signal H. Signal H is a signal comprising successive numbers separated two by two by a same constant value C. Constant value C is for example value 1. Thus, signal H for example comprises the following values, in the following order: 1 2 3 4 5 6 7 8 9 10 etc. The signal may then be a timestamping signal.

Signal H is for example a binary signal comprising numbers in hexadecimal coding, over 64 bits.

As a variation, constant value C may be any other value, for example, value 10, and the signal may for example comprise the following numbers: 2 12 22 32 42 etc., or value 5, and the signal may for example comprise the following numbers: 5 10 15 20 etc.

Circuit 102 receives a clock signal CLK having a frequency f. Generator circuit 102 for example comprises a counter incrementing signal H by the constant value C, for example, at each rising edge of clock signal CLK.

Clock signal CLK may possibly also be supplied to a clock monitoring unit (CMU), not shown. This unit enables to verify that the frequency of the clock is within a desired range of values, for example, a range centered on frequency f.

Circuit 102 receives a signal comprising an initial number INIT. Number INIT corresponds to the number from which circuit 102 increments the value of signal H.

In the case of a timestamping signal, the initial number INIT is for example 0.

Device 100 further comprises at least one circuit 104 located in a clock domain different from that of circuit 102, that is, having a clock signal with a frequency different from the frequency of signal CLK. FIG. 1 shows three circuits 104a, 104b, and 104c respectively receiving clock signals CLK1, CLK2, and CLK3, having respective frequencies f1, f2, and f3. In this example, frequencies f1, f2, and f3 are all different from one another and from frequency f. Preferably, frequencies f1, f2, and f3 are higher than frequency f.

Although FIG. 1 only shows three circuits 104 and thus three frequencies f1, f2, and f3, more generally, device 100 comprises at least one circuit 104, preferably at least two circuits 104, for example, between 1 and 10 circuits 104.

Circuits 104 are for example circuits comprising central processing units (CPU) or circuits comprising at least one peripheral.

Certain circuits 104 may be in a same clock domain. Preferably, at least two circuits 104 are in different clock domains, that is, they operate with clock signals having different frequencies.

Device 100 further comprises a circuit 106. An input of circuit 106 is coupled to the output of circuit 102 delivering signal H. Circuit 106 is configured to have the signal pass from the clock domain of circuit 102 to the clock domains of circuits 104. Circuit 106 is configured to output signals corresponding to signal H, each of these signals being synchronized at a clock signal having a frequency different from frequency f of circuit 102. Thus, signals H1, H2, and H3 shown in FIG. 1 comprise the numbers of signal H in the same order, but at different frequencies. More particularly, circuit 106 is configured to supply synchronized signals H1, H2, and H3 at frequencies f1, f2, and f3 of circuits 104a, 104b, and 104c.

Figure 2:
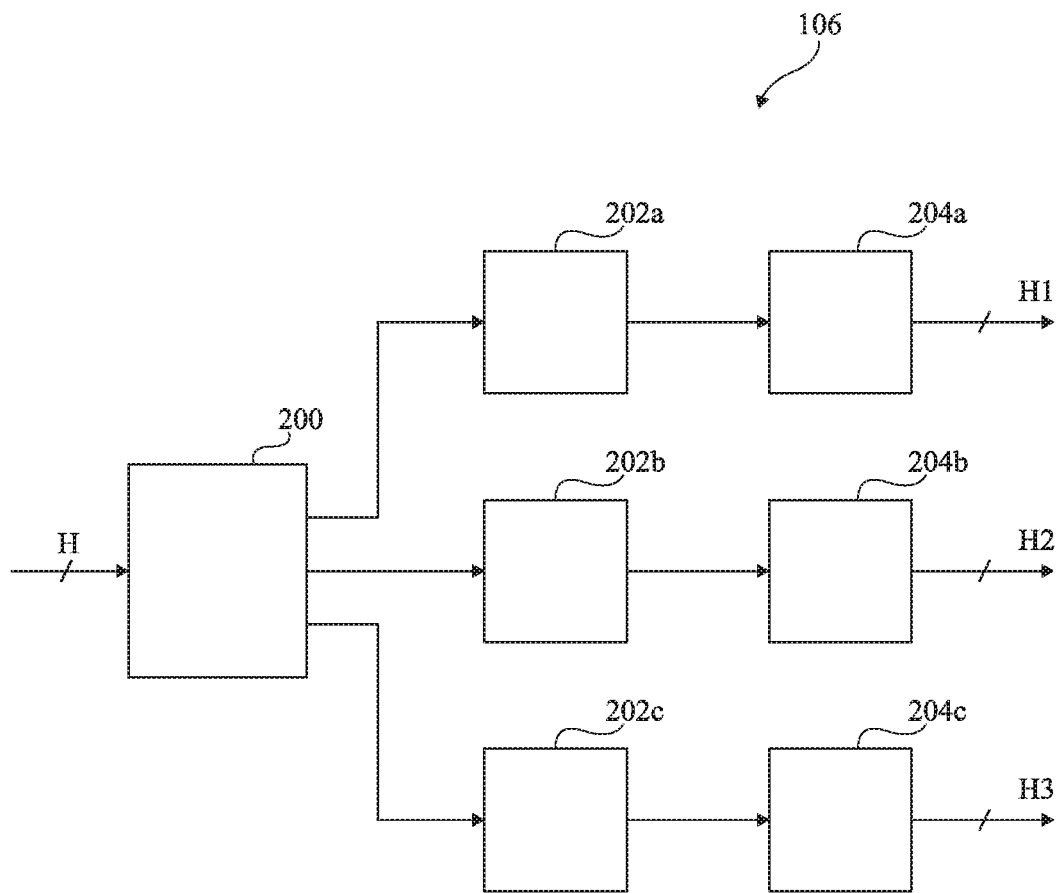
FIG. 2 schematically shows a portion of the device of FIG. 1 (receiving signals comprising successive numbers, separated two by two by the same value, coming from a common origin (counter))

An example of a circuit 106 is described in further detail in relation with FIG. 2.

An error may appear on signal H or one of signals H1, H2, and H3 in circuit 102 upon generation of the signal, in circuit 106 or on one of the data buses which transmit the signals between the circuits of device 100. These errors are for example correspond to the change of a value of one bit of a number of the signal. These errors are for example caused by the circuits themselves, a bit being for example locked at a value, or by spontaneous modification, for example, caused by radiation.

Each circuit 104 is coupled, by an input, to an output of circuit 106. More particularly, circuit 104a is coupled to the output of circuit 106 delivering signal H1. Circuit 104b is coupled to the output of circuit 106 delivering signal H2. Circuit 104c is coupled to the output of circuit 106 delivering signal H3.

Circuits 108 (108a, 108b, 108c) are coupled, preferably connected, by their inputs, to the outputs of circuit 106. Each circuit 108 is coupled, preferably connected, to the same output as one of the circuits 104. More particularly, the input of circuit 108a is coupled to the same output as the one coupled to circuit 104a, and circuit 108a receives signal H1. The input of circuit 108b is coupled to the same output as the one coupled to circuit 104b, and circuit 108b receives signal H2. The input of circuit 108c is coupled to the same output as the one coupled to circuit 104c, and circuit 108c receives signal H3.

Device 100 thus comprises as many circuits 108 as there are circuits 104, for whom the integrity of the signal H is to be checked.

Circuits 108 are configured to verify that the successive numbers of the output signals of circuit 106 are separated by constant value C.

Each circuit 108 supplies, at an output, a signal ER (ER1, ER2, ER3) taking a first value when the successive numbers of signal H1, H2, or H3 are separated by constant value C and a second value when they are separated by another value than constant value C.

Figure 3:
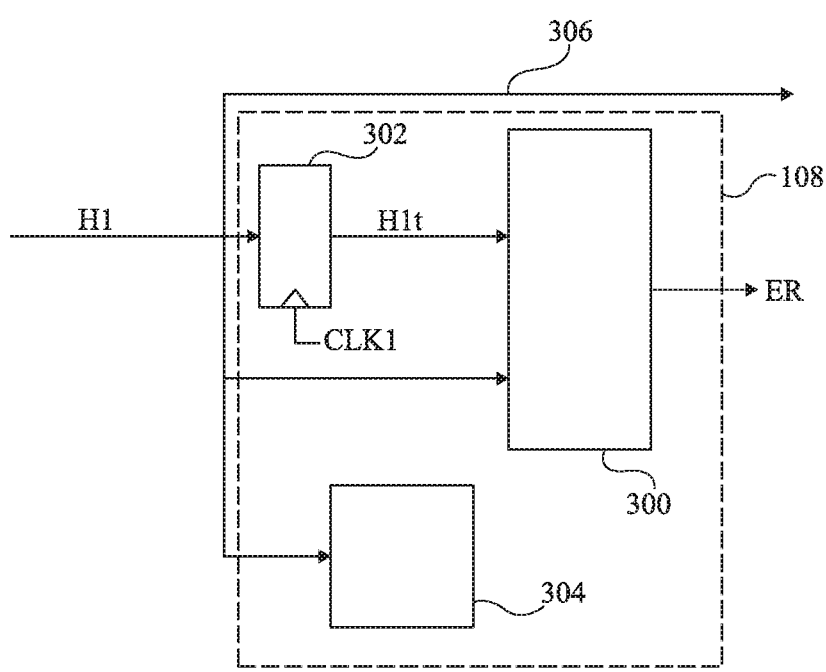
FIG. 3 schematically shows another portion of the device of FIG. 1.

An example of a circuit 108 is described in further detail in relation with FIG. 3.

Circuit 102 further receives a reset signal RESET. Thus, circuit 102 for example starts counting again from initial number INIT to a time determined by signal RESET, for example, by a rising edge of signal RESET.

At the starting of device 100 and/or at the resetting of device 100 at a time determined by signal RESET, device 100 may implement steps of verification of the operation of device 100.

During the verification steps, a predetermined number is programmed into circuit 102, for example, via an input, not shown. This number is then supplied to circuit 106 then to circuits 108. Circuit 108 may transmit the received number to a circuit capable of comparing it with the number programmed into circuit 102. It is then possible to determine whether errors are caused by device 100 itself. Preferably, at least two predetermined numbers are sent, the two numbers being selected so that each bit forming a number of the signal is equal to 0 in at least one of the sent numbers and is equal to 1 in at least another one of the sent numbers. For example, the two following numbers (in hexadecimal form) are sent during the initialization steps: AAAAAAAA and 55555555.

As a variation, the device may comprise, for each circuit 104, a clock monitoring unit (CMU), not shown. Each unit enables to verify that the signal does not stay constant for a given time window. The unit therefore verifies that the value of the signal H changes in the predetermined time window. The time window is for example chosen to be greater than the duration between two changes of value of the signal H. The monitoring unit can thus detect an interruption of the circuit 102, for example caused by a fault.

FIG. 2 schematically shows in the form of blocks an example of a portion of device 100 of FIG. 1. More precisely, FIG. 2 shows an example of implementation of circuit 106.

Circuit 106 comprises a circuit 200 receiving signal H as an input. Circuit 200 for example comprises a coder and a demultiplexer. Thus, signal H is coded, for example, over 9 bits, including 7 data bits and 2 synchronization bits. The coded signal is sent, by the demultiplexer, towards a plurality of outputs of circuit 200.

Circuit 106 comprises circuits 202. The example of FIG. 2 comprises three circuits 202. More generally, there are for example as many circuits 202 as there are circuits 108 in device 100 (FIG. 1). Each output of circuit 200 having coded signal H sent thereto is coupled, preferably connected, to the input of a circuit 202.

Each circuit 202 is an asynchronous transformer, or resynchronizing circuit. Each circuit 202 is configured to have a signal transit from one clock domain to another. Each circuit 202 is configured to have coded signal H transit from the clock domain of circuit 102 (frequency f) to the clock domain of the corresponding circuit 104 (frequency f1, f2, or f3).

Circuit 106 comprises circuits 204. The example of FIG. 2 comprises three circuits 204. More generally, there are as many circuits 204 as there are circuits 202.

An input of each circuit 204 is coupled, preferably connected, to an output of one of circuits 202. In FIG. 2, an input of circuit 204a is coupled to an output of circuit 202a, an input of circuit 204b is coupled to an output of circuit 202b, and an input of circuit 204c is coupled to an output of circuit 202c.

Each circuit 204 comprises a decoder to obtain, at the output, numbers having the same size (the same number of bits) as in signal H synchronized on the corresponding clock domain.

The output of circuit 204a transmits signal H1, synchronized on the frequency f1, the output of circuit 204b transmits signal H2, synchronized on the frequency f2, and the output of circuit 204c transmits signal H3, synchronized on the frequency f3.

FIG. 3 schematically shows in the form of blocks another portion of device 100 of FIG. 1. More particularly, FIG. 3 comprises an example of implementation of circuit 108. The example of FIG. 3 is described in the case of circuit 108a, receiving signal H1 as an input. However, the other circuits 108 are identical to the circuit described in relation with FIG. 3.

Circuit 108 comprises a comparison circuit 300. Circuit 108 further comprises a delay circuit 302. Signal H1 is supplied to the input of circuit 302 and to an input of circuit 300. The output of circuit 302 is coupled, preferably connected, to another input of circuit 300. Signal H1 is also delivered at the output of circuit 108 over a connection 306.

Delay circuit 302 receives as an input clock signal CLK1, that is, the clock signal of the clock domain of circuit 104a having circuit 108a coupled thereto, an outputs a signal H1t. Circuit 302 delays the signal H1 by a value equal to the period of the clock signal CLK1.

Circuit 300 compares each value of signal H1 with the previous value of signal H1, the previous value being supplied at the output of circuit 302, to obtain the difference between these values. Difference preferably means a difference in absolute value, that is, a positive value. If the difference is equal to 0 or C (the incrementation value of circuit 102, or any increment caused by circuit 106), that is, if the two values are identical or successive, output signal ER is equal to the first value. If the difference is equal to any other value, the output signal is equal to the second value.

As a variation, the output signal takes the first value if the difference is in the range from 0 to C, and the second value if it is not the case.

As a variation, the output signal take the first value if the difference is in the range from 0 to C', and the second value if it is not the case, the value C' being equal to the value C plus a tolerance margin.

Circuit 108 further comprises a circuit 304. Circuit 304 receives signal H1 as an input. Circuit 304 is configured to receive the number(s) sent during the verification steps described in relation with FIG. 1. Circuit 304 compares the received number and the sent number during the verification steps or transmits the received value by using the connection 306 so that the comparison can be made by an external circuit, not shown.

Figure 4:
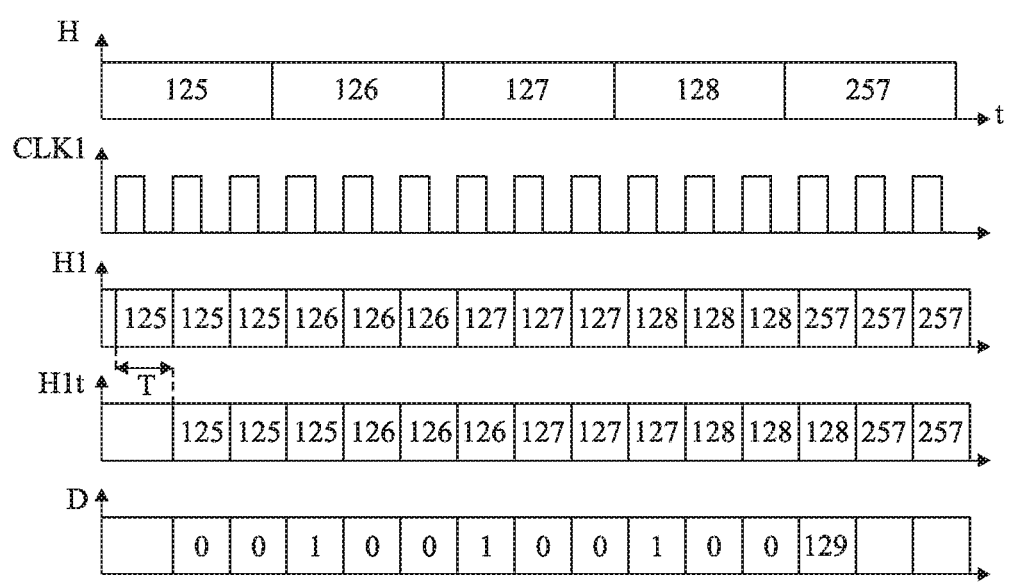
FIG. 4 shows an example of operation of the device of FIG. 1.

FIG. 4 is a timing diagram showing an example of operation of device 100, for example, the operation of circuit 108 of FIG. 3.

The timing diagram shows signal H, clock signal CLK1 of the clock domain of circuit 104a, signal H1, signal H1t, and signal D of difference between signals H1 and H1t obtained by circuit 300.

The numbers of signal H are, in this portion, successively 125, 126, 127, 128, 257. It is indeed considered in this example that an error has appeared, on signal H or in generation circuit 102, before the generation of number 129 and after the generation of number 128.

Signal H1 corresponds to signal H in a different clock domain, here of frequency f1 higher than f. Thus, each number transmitted by signal H is transmitted successively a plurality of times by signal H1. In the example of FIG. 4, each number is repeated three times. In practice, the number of repetitions depends on the frequency of circuit 102 and the frequency of the corresponding circuit 104. For a same signal, signal H1 for example, certain numbers may be repeated a number of times different from the others.

Thus, the difference, in the absence of an error, between a number transmitted by H1 and the previous number is equal to 0 or to C (here, C is equal to 1).

Signal H1t is equal to signal H1 delayed by a time T corresponding to a period of clock signal CLK1. Thus, at each time and when there are no errors, the number transmitted by signal H1t is equal to the number transmitted by signal H1 during the previous period of clock signal CLK1.

Signal D is equal to the difference between signals H1 and H1t. Thus, when there are no errors, that is, before number 257, signal D transmits numbers 0 and 1.

When an error appears, the number transmitted by H1 becomes 257 in the present example. The difference between number 257 of signal H1 and the previous number (128) of signal H1t is equal to 129. Thus, signal D takes value 129. The error can thus be detected.

Various embodiments and variations have been described. Those skilled in the art will understand that certain features of these various embodiments and variations may be combined, and other variations will occur to those skilled in the art. In particular, other implementations of circuit 106 are possible.

Finally, the practical implementation of the described embodiments and variations is within the abilities of those skilled in the art based on the functional indications given hereabove.

What is claimed is:

1. A device comprising:
   a first circuit configured to send a signal comprising numbers successively separated by a constant value to at least one second circuit, each second circuit being in a clock domain different from a clock domain of the first circuit; and
   at least one third circuit configured to determine whether the successive numbers of the signal received by the second circuit are separated by the constant value,
   wherein the signal is sent to a respective third circuit in each of the clock domains different from the clock domain of the first circuit.

2. The device of claim 1, wherein each number is a binary number.

3. The device of claim 2, wherein each number comprises 64 bits.

4. The device of claim 1, wherein the first and third circuits are coupled by a fourth circuit, the fourth circuit configured to transit the signal from the clock domain of the first circuit to the clock domains of the second circuits.

5. The device of claim 1, wherein the at least one second circuit comprises at least two second circuits in different clock domains.

6. The device of claim 1, wherein the first circuit is a timestamping circuit.

7. The device of claim 1, wherein the constant value is equal to 1.

8. The device of claim 1, wherein each third circuit comprises a comparison circuit configured to compare a number of an input signal with a number of a signal corresponding to a delayed input signal.

9. The device of claim 8, wherein each third circuit comprises a delay circuit coupled between an input of the third circuit and an input of the comparison circuit.

10. A method for verifying the device of claim 1, the comprising:
    transferring at least one predetermined number from the first circuit to the respective third circuit; and
    comparing the number received by the respective third circuit with the predetermined number.

11. The method of claim 10, wherein at least two predetermined numbers are transferred, the two predetermined numbers being selected so that each bit forming a number is equal to 0 in at least one of the predetermined numbers and is equal to 1 in at least another one of the predetermined numbers.

12. The method of claim 10, further comprising verifying a value of signal changes in a predetermined time window.

13. A method for verifying a device, wherein the device comprises a first circuit configured to send a signal comprising numbers successively separated by a constant value to at least one second circuit, each second circuit being in a clock domain different from a clock domain of the first circuit and at least one third circuit configured to determine whether the successive numbers of the signal received by the second circuit are separated by the constant value, wherein the signal is sent to a respective third circuit in each of the clock domains different from the clock domain of the first circuit, the method comprising:
    transferring at least one predetermined number from the first circuit to the respective third circuit;
    receiving the number by the third circuit;
    comparing the received number with the predetermined number; and
    verifying a value of signal changes in a predetermined time window.

14. The method of claim 13, wherein at least two predetermined numbers are transferred, the two predetermined numbers being selected so that each bit forming a number is equal to 0 in at least one of the predetermined numbers and is equal to 1 in at least another one of the predetermined numbers.

15. The method of claim 13, wherein each number is a binary number.

16. The method of claim 13, wherein the constant value is equal to 1.

* * * * *